(12) United States Patent
Kawamata

(10) Patent No.: US 6,728,136 B2
(45) Date of Patent: Apr. 27, 2004

(54) ELECTRONICALLY REWRITABLE NON-VOLATILE SEMICONDUCTOR MEMORY DEVICE

(75) Inventor: Junya Kawamata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/357,372

(22) Filed: Feb. 4, 2003

(65) Prior Publication Data

US 2003/0117844 A1 Jun. 26, 2003

Related U.S. Application Data

(62) Division of application No. 09/717,296, filed on Nov. 22, 2000, now Pat. No. 6,535,420.

(30) Foreign Application Priority Data

May 2, 2000 (JP) .................................. 2000-133765

(51) Int. Cl.$^7$ .............................................. G11C 16/04
(52) U.S. Cl. .................. 365/185.04; 365/239; 365/195; 365/189.01; 365/230.03; 365/185.11
(58) Field of Search ............................ 365/185.04, 239, 365/195, 189.01, 230.03, 185.11

(56) References Cited

U.S. PATENT DOCUMENTS 4,975,878 A    12/1990 Boddu et al.
5,513,136 A *  4/1996  Fandrick et al. ........ 365/185.04
5,912,849 A *  6/1999  Yasu et al. ................... 365/195
5,974,500 A    10/1999 Maletsky et al.
5,991,197 A * 11/1999 Ogura et al. ............ 365/185.11
6,009,012 A    12/1999 Sibigtroth et al.
6,026,016 A    2/2000  Gafken
6,108,235 A    8/2000  Honma

FOREIGN PATENT DOCUMENTS

JP          8-44628        2/1996

* cited by examiner

Primary Examiner—Connie C. Yoha
(74) Attorney, Agent, or Firm—Arent Fox, PLLC

(57) ABSTRACT

The present invention provides a non-volatile semiconductor memory device that can protect each block without increasing a memory element area, and make an access to the memory cells in hidden blocks in a hidden mode in which the hidden blocks are accessed. This electrically rewritable non-volatile semiconductor memory device includes K non-volatile memory elements that store protection information, a non-volatile memory element that stores a protection status, and a storage area that is logically divided into $2^K$ or less blocks. In accordance with information stored in the K non-volatile memory elements and the non-volatile memory element that stored the protection status, a write operation is inhibited in the successive bocks in storage area.

6 Claims, 9 Drawing Sheets

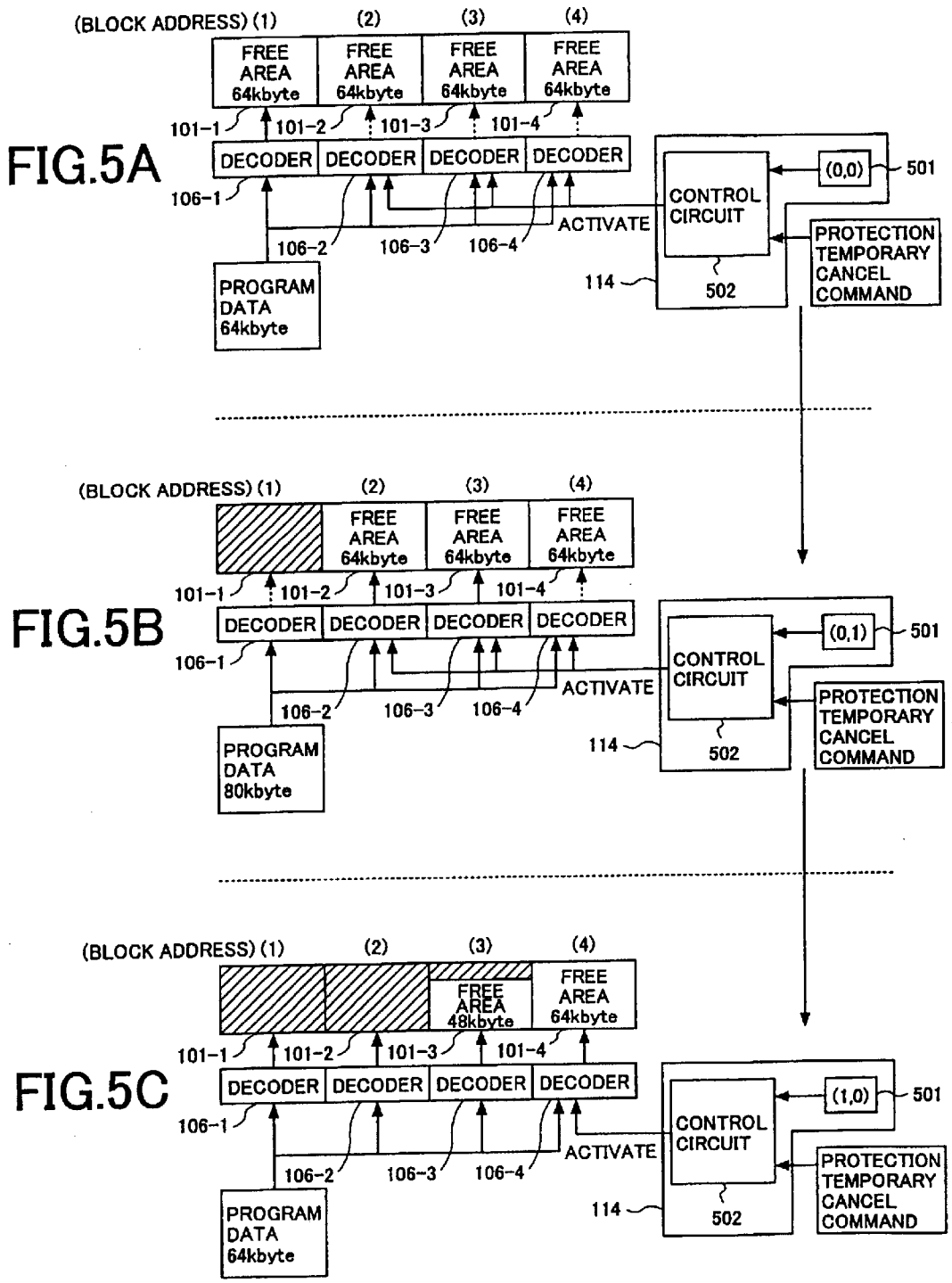

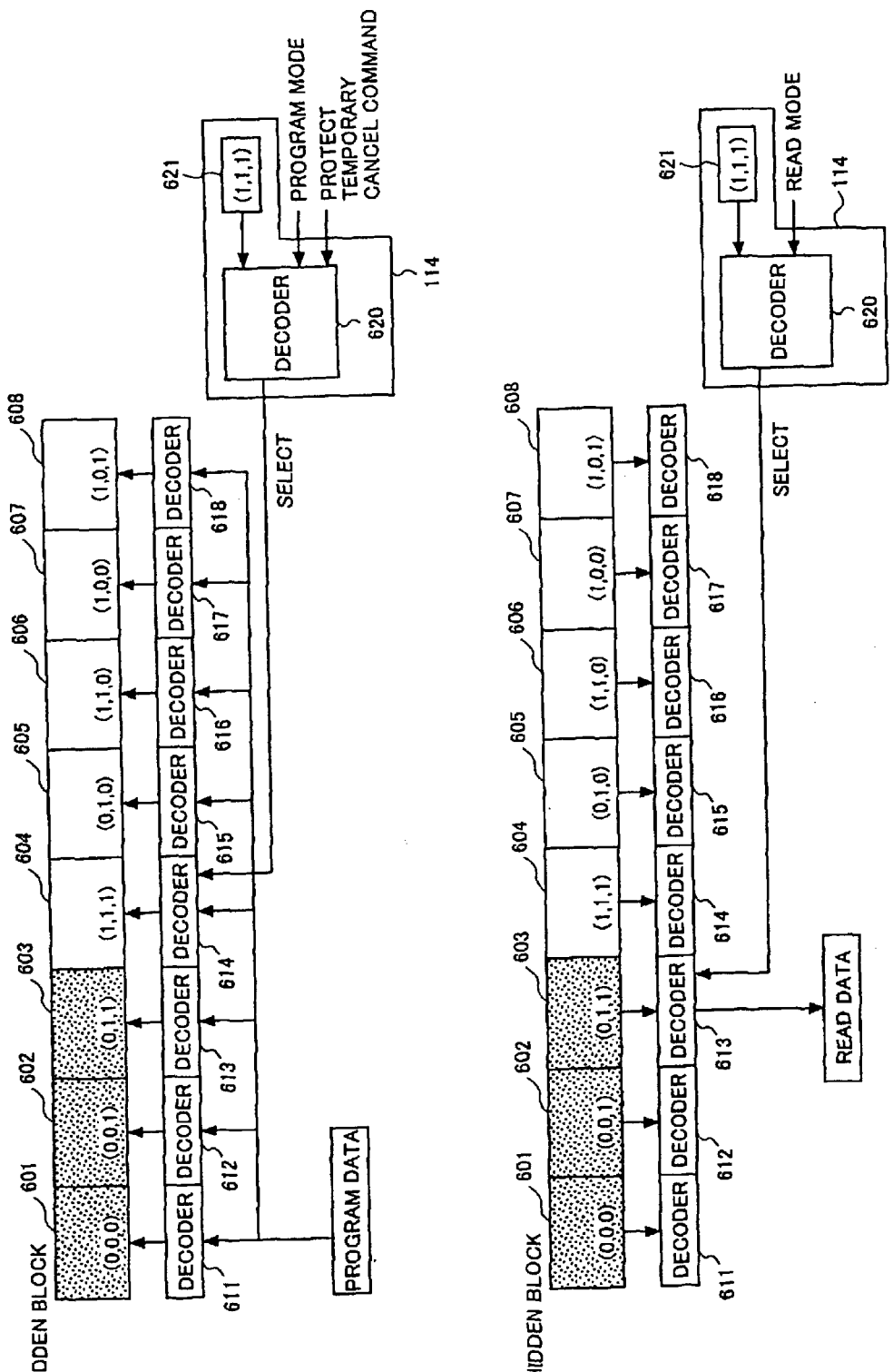

ELECTRONICALLY REWRITABLE NON-VOLATILE SEMICONDUCTOR MEMORY DEVICE

This is a Division Application No. 09/717,296 filed Nov. 22, 2000, now U.S. Pat. Ser. No. 6,535,420. The disclosure of the prior application is hereby incorporated by reference herein in its entirety.

BACKGROUND OF THE INVENTION

1. Field of the Invention

The present invention generally relates to non-volatile semiconductor memory devices, and, more particularly, to a non-volatile semiconductor memory device that has protection functions to prevent data damage due to a wrong write operation.

2. Description of the Related Art

Conventionally, a flash memory has a protection function to prevent data damage due to a wrong write operation. A memory cell array in the flash memory is divided into blocks that are erase units, and protection is provided for each erase unit. The size of each block is normally 64 Kbytes. In order to provide protection for an even smaller unit, there has been a demand to reduce the size of blocks. However, blocks are physically independent of each other. If the block size becomes too small, the chip size becomes too large. When the block size is 64 Kbytes, a 4-Mbit memory contains 8 blocks, and an 8-Mbit memory contains 16 blocks. A flash memory contains non-volatile memory elements that store the same number of protection information pieces as the number of blocks, and each block is protected using the non-volatile memory elements.

Meanwhile, as flash memories have been increasing in capacity, 32-Mbit flash memories and 64-Mbit flash memories have been developed. A 64-Mbit memory contains 164 blocks. Accordingly, as the number of blocks inside a memory increases, the same number of non-volatile memory elements that store protection information is required. As a result, the chip size also increases. Therefore, in a large-volume memory, protection is provided for a plurality of blocks at once, so as to reduce the number of non-volatile memory elements required and also reduce the chip size.

In a flash memory, a storage area that stores information such as manufacturer information is included, as well as a main storage area. Such a storage area is called a hidden block. Once protection is provided for the hidden block, the protected state cannot be canceled. The size of the hidden block varies with the type of the flash memory, for instance, in a range of 512 bytes to 64 Kbytes.

When a program is executed on a flash memory, the protection status of a block to be programmed should be read out from the memory elements prior to the execution of the program. If the block should be protected, a program voltage is generated so as to provide the protection.

FIG. 1 is a schematic view of the structure of a conventional flash memory 100. This flash memory 100 comprises a main storage area 101, a hidden block 104, y-decoders 106-1 to 106-4, an address buffer 110, a block select decoder 111, an x-predecoder 112, a hidden block x-predecoder 113, a protection status memory element group 114, a program voltage generating circuit 115, and a sense amplifier and input/output buffer unit 116. The main storage area 101 comprises erase units (blocks) 101-1 to 101-n, and x-decoders 102 and 103. The hidden block 104 is provided with a hidden block x-decoder 105.

When data is read from the flash memory 100, an address is inputted into the address buffer 110. The address buffer 110 then sends a block address to the block select decoder 111 in accordance with the inputted address. A block select signal outputted from the block select decoder 111 and a row address supplied from the address buffer 110 are decoded by the x-predecoder 112, and the output of the x-predecoder 112 is sent to the x-decoders 102 and 103. The x-decoders 102 and 103 select one of the word lines of memory cells. The y-decoders 106-1 to 106-4 then select a bit line in accordance with the block select signal and a column address. By doing so, the data stored in the selected memory cell is sent to a data bus line, and then outputted as output data via the sense amplifier and input/output buffer unit 116.

When data is stored in the flash memory 100, i.e., when a program is executed, a program execution command is inputted. Upon receipt of the program execution command, information stored in the protection status memory element corresponding to a block having a cell to be programmed is examined. If the information stored in the protection status memory element is in an unprotected state (i.e., a state that requires no protection), input data is stored in the cell selected in accordance with an address input by executing the program and by a program voltage being generated in the program voltage generating circuit 115 in accordance with the input data, as in the above-mentioned case of reading data from the flash memory. By contrast, if the information stored in the protection status memory element is in a protected state (i.e., a state that requires protection), the program voltage generating circuit 115 is not activated so as not to generate a program voltage. In such a case, a cell is also selected in accordance with an address input in the same manner as in the above-mentioned case of reading data. However, with no program voltage, the program is not executed on the selected cell.

Meanwhile, when reading is performed or a program is executed on the hidden block 104, a hidden block access command 123 is inputted into hidden block memory elements in the hidden block x-predecoder 113 and the protection status memory element group 114. A word line is then selected in the hidden block 104 via the hidden block x-decoder 105, and reading is performed or the program is executed on the selected memory cell in the hidden block, in the same manner as in the above-mentioned case of performing reading or executing a program on a selected memory cell in the main storage area 101.

FIGS. 2A to 2C show a conventional protection method. In this figure, the same components as in FIG. 1 are denoted by the same reference numerals. As shown in FIGS. 2A to 2C, the protection status memory element group 114 comprises a judgement circuit 202 and non-volatile memory elements 201-1 to 201-4 that store protection statuses of the blocks to be protected. The numbers (1) to (4) allotted to the non-volatile memory elements 201-1 to 201-4 and the blocks 101-1 to 101-4 indicate block addresses.

FIG. 2A illustrates a state in which no data is stored in any of the blocks 101-1 to 101-4, and no protection is provided. In this state, 64-Kbyte data is to be written in the block with the block address (2).

When a program is executed, information stored in the non-volatile memory element 201-2 of the block address (2) is first read from the protection status memory element group 114. If the information stored in the non-volatile memory element 201-2 is "0", the block with the block address (2) is in the unprotected state. If the information stored in the non-volatile memory element 201-2 is "1", the block with the block address (2) is in the protected state. In the case shown in FIG. 2A, "0" is read out from the non-volatile memory element 201-2. Accordingly, the block with the block address (2) is in the unprotected state, and a program voltage is generated by the program voltage generating circuit 115. The block with the block address (2) is selected in accordance with an inputted address in the same manner as described with reference to FIG. 1, and the 64-Kbyte input data is written in the block with the block address (2). In the non-volatile memory element 201-2 in the protection status memory element group 114, "1" is written so as to indicate the protected state.

FIG. 2B shows a case where more data is to be added to the block with the block address (2), which already holds data and is protected. The information stored in the non-volatile memory element 201-2 with the block address (2) is read from the protection status memory element group 114. Since "1" is read out from the non-volatile memory element 201-2, the block with the block address (2) is in the protected state in this case. Accordingly, no program voltage is generated by the program voltage generating circuit 115, and the sense amplifier and input/output buffer unit 116 is not activated. As described in the case shown in FIG. 1, even if an address is inputted from the outside, no data is written in the block with the block address (2).

FIG. 2C shows a case where 64-Kbyte data is to be written in the block with the block address (4) while the non-volatile memory element 201-2 with the block address (2) is protected. In this case, the data is written in the block with the block address (4), and "1" is written in the non-volatile memory element 201-4 in the protection status memory element group 114.

In recent years, as the capacity of a flash memory has increased, a method of providing protection for a plurality of blocks at once has been more and more often employed. As a result, protection can be provided for large-size data, for instance, 256-Kbyte data. However, the amount of data to be protected is normally not as large as 256 Kbytes, and a large proportion of the protected area is left unused. In a case where the amount of data to be protected is 100 Kbytes, for instance, no data is stored in the remaining 156-Kbytes data area.

In a hidden mode in which data having a few bytes is written in the hidden block, the remaining area in the hidden block cannot be used, once protection is provided for the hidden block. However, there is an increasing demand to write data in the remaining area in the hidden block without destroying the already written data.

To satisfy such a demand, the size of each block should be reduced. However, smaller blocks result in an increase in memory element size, as mentioned above.

Furthermore, an access to the hidden block requires a smaller area, compared with an access to the main storage area. Accordingly, there is also a demand to make an access without inputting an address. At the present, however, it is necessary to input an address to select the memory cells of the hidden block.

SUMMARY OF THE INVENTION

A general object of the present invention is to provide non-volatile semiconductor memory devices in which the above disadvantages are eliminated.

A more specific object of the present invention is to provide a non-volatile semiconductor memory device that can protect each block without increasing the memory element area, and make an access to the memory cells in a hidden block with no address input in a hidden mode.

The above objects of the present invention are achieved by a non-volatile semiconductor memory device that is electrically rewritable, which device comprises: K non-volatile memory elements that store protection information; a non-volatile memory element that stores information concerning a protection status; and a storage area that is logically divided into $2^K$ or less blocks. In this device, a write operation on successive blocks in the storage area is inhibited in accordance with the protection information stored in the K non-volatile memory elements and the information concerning the protection status stored in the non-volatile memory element.

With the above structure, a write operation is performed logically in a first block, and the first block is then protected. Here, the K non-volatile memory elements store information indicating a block in which data has last been written. At the same time, information indicating a protected state is written in the non-volatile memory element that stores the protection status. Accordingly, the write operation is resumed in the block next to the last written block indicated by the information stored in the K non-volatile memory elements. Thus, the written data can be prevented from being destroyed.

The above objects of the present invention are also achieved by a non-volatile semiconductor memory device that is electrically rewritable, which device comprises: K non-volatile memory elements that store protection information; and a storage area that is logically divided into $2^K$ or less blocks. In this device, successive blocks are released from a write inhibited state in the storage area, in accordance with the protection information stored in the K non-volatile memory elements.

In the above structure, protection is always provided. When data is to be written, the write inhibition is cancelled in a block indicated by the protection information as the first block in which the write inhibition can be cancelled. The protection information is stored in the K non-volatile memory elements. After the data has been written, the protection information indicating the block next to the last block in which the data has been written is stored in the K non-volatile memory elements. Thus, the written data can be protected from damage when more data is written.

The above and other objects and features of the present invention will become more apparent from the following description taken in conjunction with the accompanying drawings.

BRIEF DESCRIPTION OF THE DRAWINGS

FIGS. 5A to 5C illustrate a second embodiment of the flash memory of the present invention;

FIGS. 7A to 7B illustrate a fourth embodiment of the flash memory of the present invention;

DESCRIPTION OF THE PREFERRED EMBODIMENTS

The following is a description of embodiments of the present invention, with reference to the accompanying drawings.

Figure 1:
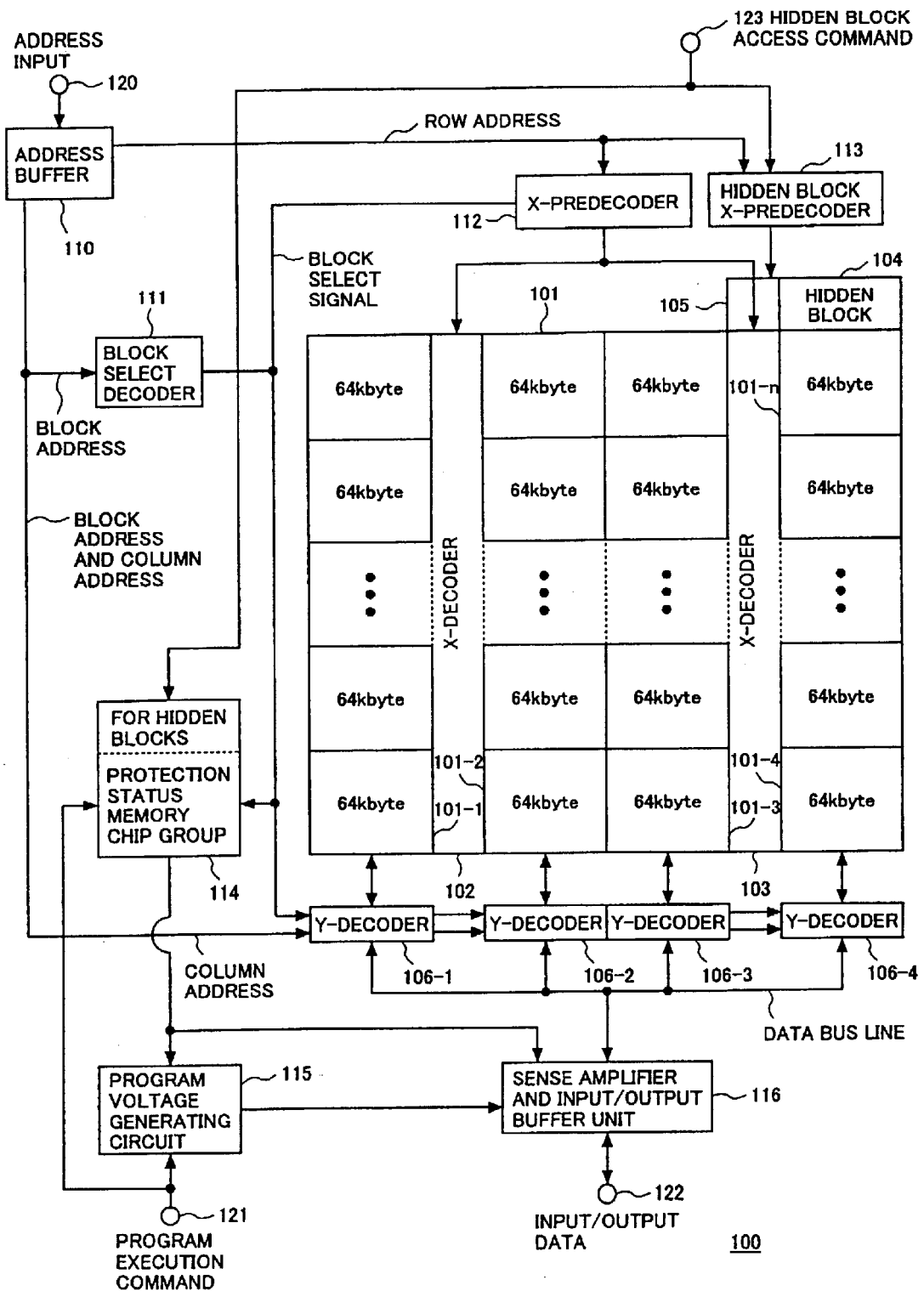
FIG. 1 is a schematic view of the structure of a conventional flash memory.
Figure 2A:
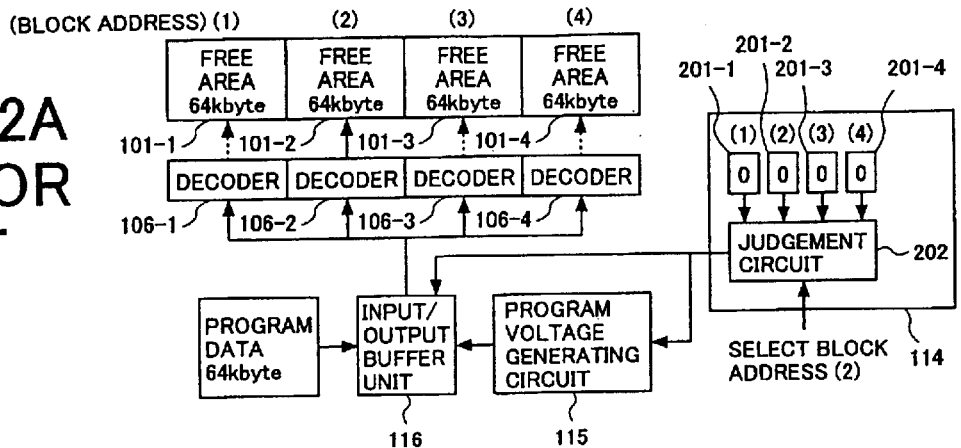
FIGS. 2A to 2C illustrate a conventional method of protecting written blocks.
Figure 2B:
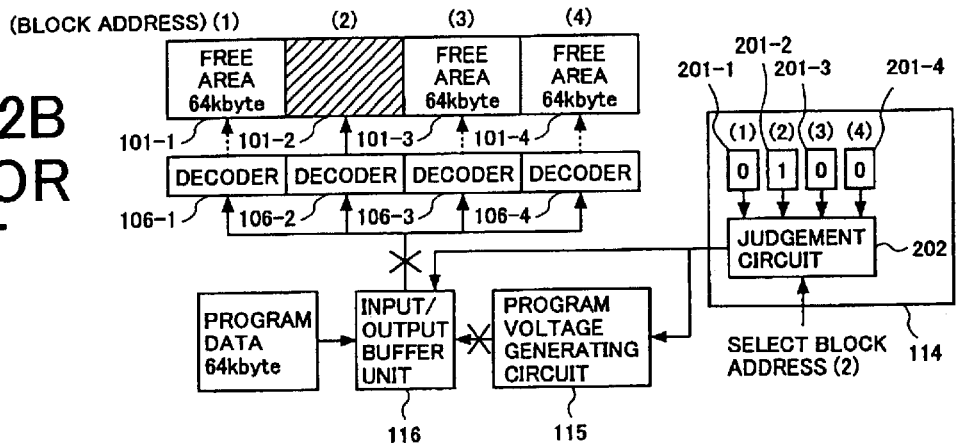
Figure 2C:
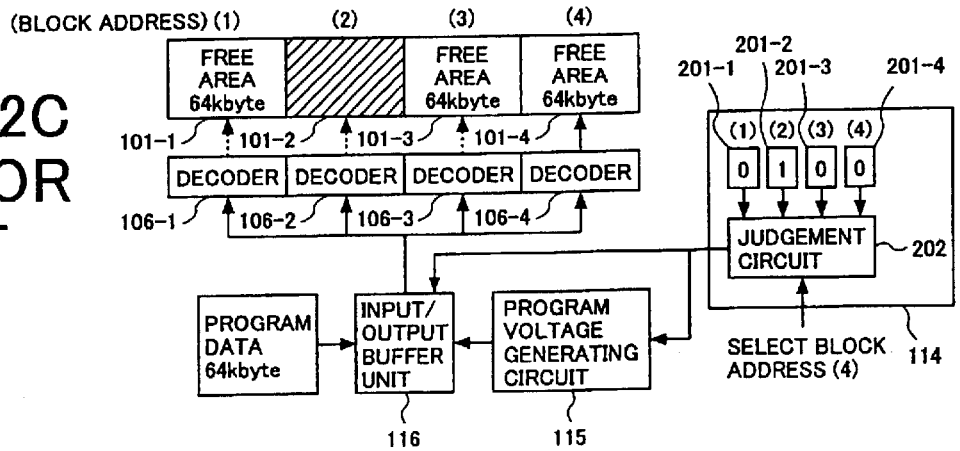
Figure 3:
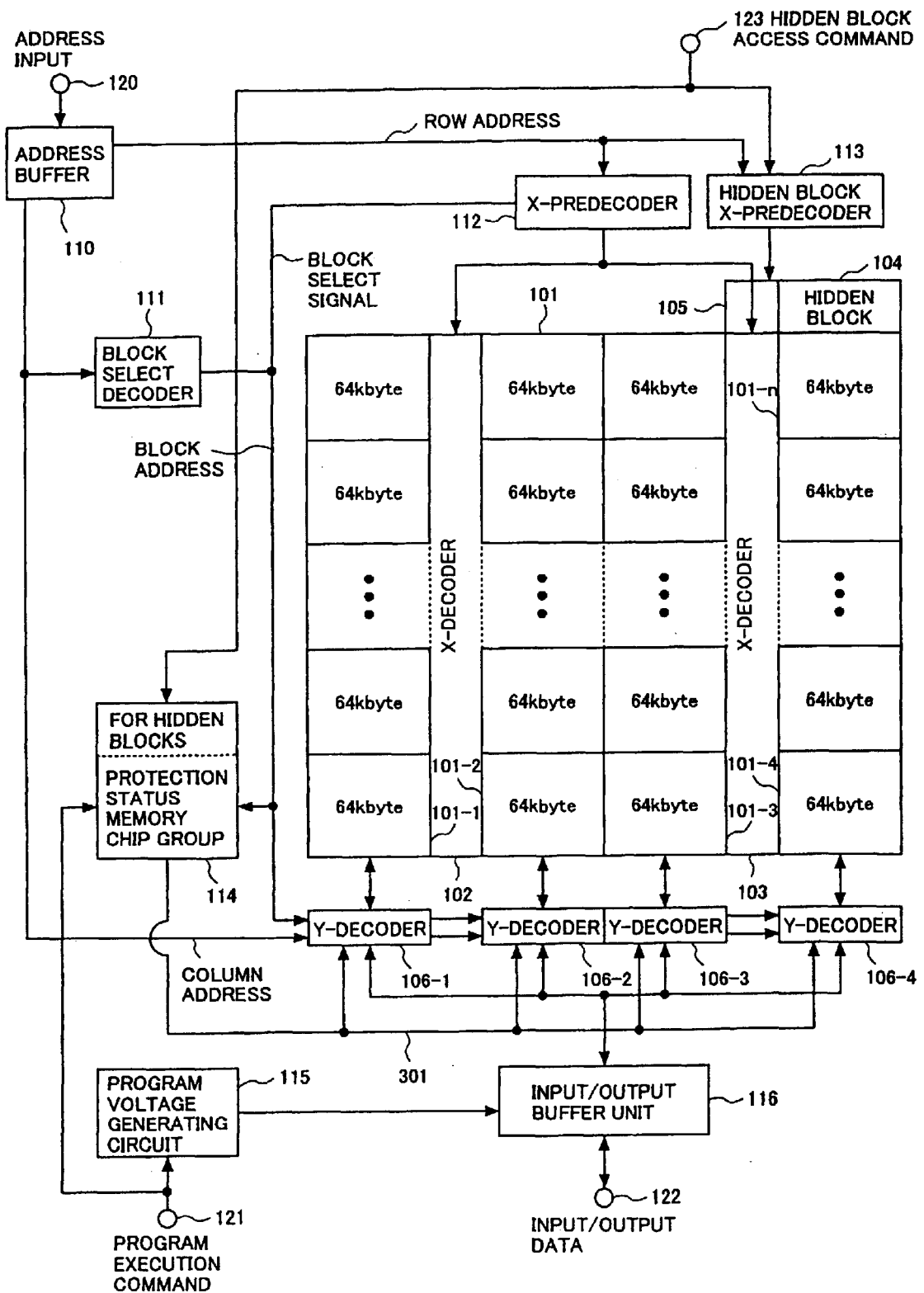
FIG. 3 is a schematic view of the structure of a flash memory of the present invention.

FIG. 3 shows the structure of one embodiment of a flash memory in accordance with the present invention. In this figure, the same components as in FIG. 1 are denoted by the same reference numerals. In the structure shown in FIG. 1, a control signal is transmitted from the protection status memory element group 114 to the program voltage generating circuit 115. By contrast, in the structure shown in FIG. 3, the output of the protection status memory element group 114 is supplied to the y-decoders 106-1 to 106-4. In such a structure, the decoder of a block to be protected is not selected, so that no data writing is performed. Thus, the block can be protected.

Figure 4A:
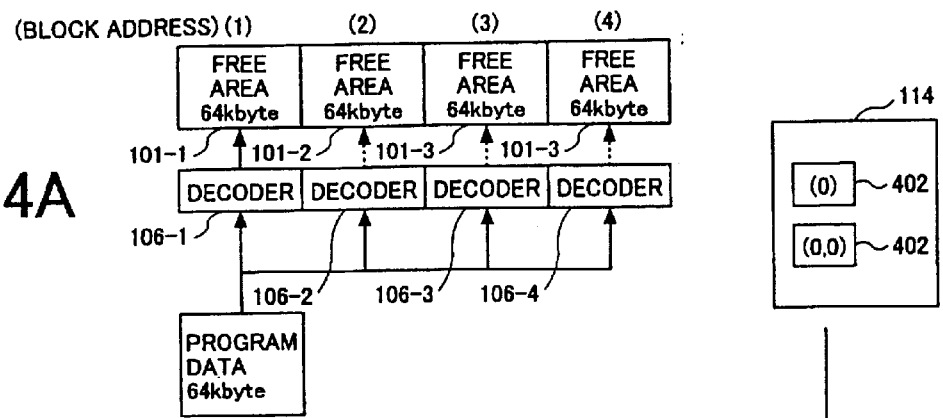
FIGS. 4A to 4C illustrate a first embodiment of the flash memory of the present invention.
Figure 4B:
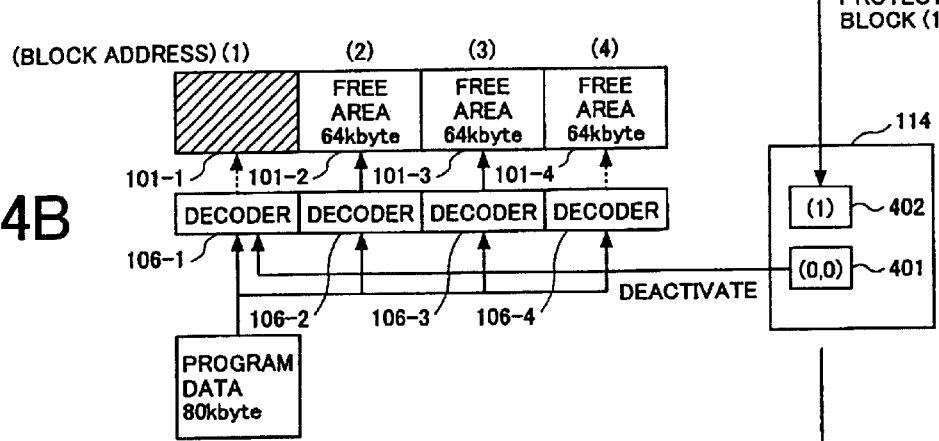
Figure 4C:
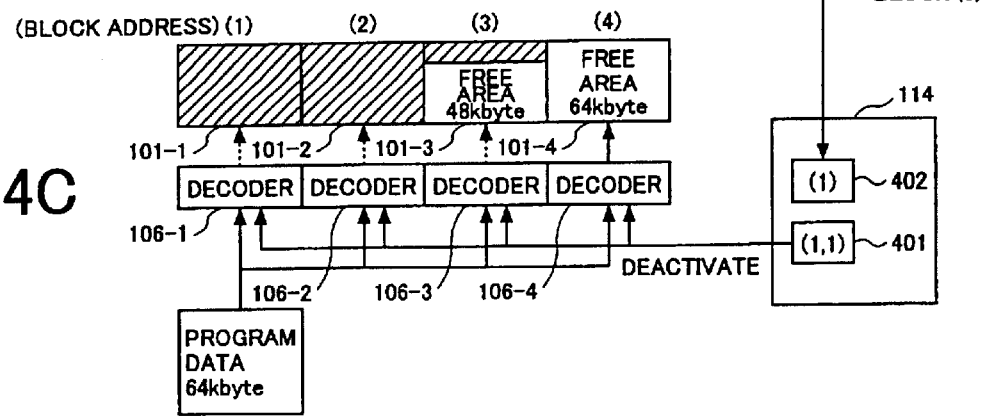

FIGS. 4A to 4C illustrate a first embodiment of the present invention. In this embodiment, the 64-Kbyte blocks (1) to (4) are logically successive. In other words, the block addresses (1) to (4) are logically successive. As shown in FIGS. 4A to 4C, the 64-Kbyte blocks are protected one by one. The protection status memory element group 114 shown in FIG. 4A includes a 2-bit non-volatile memory element 401 that indicates which bit a program has been last executed on, and a 1-bit non-volatile memory element 402 that indicates whether or not a program has been executed. If the program has not been performed at all, "0" is stored in the non-volatile memory element 402. If the program has been performed even once, "1" is stored in the non-volatile memory element 402.

FIG. 4A shows a case where no data is stored in any of the blocks 101-1 to 101-4, and none of the blocks 101-1 to 101-4 is protected. In FIG. 4A, 64-Kbyte data is to be written. When a program is executed, information stored in the non-volatile memory element 402 in the protection status memory element group 114 is read out. In this case, "0" is read out from the non-volatile memory element 402, which indicates the program has not been executed yet. The non-volatile memory element 402 in the protection status memory element group 114 also stores values (0, 0) that indicates the block (1). Accordingly, the decoder 106-1 automatically selects the block (1). Here, it is also possible to select a block with an address inputted from the outside. The 64-Kbyte data is then written in the block (1), and "1" for indicating that the program has been executed is stored in the non-volatile memory element 402. Since the last written block is the block (1) in this case, the non-volatile memory element 401 remains (0, 0) for indicating the block (1). It should be noted that the values (0, 0) stored in the non-volatile memory element 401 indicate the block (1), values (0, 1) indicate the block (2), values (1, 1) indicate the block (3), and values (1, 0) indicate the block (4).

FIG. 4B shows a case where the 64-Kbyte data has been written in the block (1), the block (1) is protected, and 80-Kbyte data that requires two blocks is to be written. The non-volatile memory element 401 stores the values (0, 0) that indicates the block (1) is protected, while the non-volatile memory element 402 stores "1" for indicating that the program has been executed. Once the program is executed in this case, the block (1) is not selected, but the 80-Kbyte data is written in the blocks (2) and (3). When the data write operation is performed, the program voltage generating circuit 115 generates a program voltage, so that the data is written in the selected blocks (2) and (3). However, the decoder 106-1 is not selected, thereby preventing a wrong write operation in the block (1). After the data write operation is performed on the block (3), the values (1, 1) for indicating that the blocks (1) to (3) are protected are stored in the non-volatile memory element 401.

FIG. 4C shows a case where the blocks (1) to (3) are protected, and 64-Kbyte data is to be added. Since the non-volatile memory element 401 holds the values (1, 1) that indicate the blocks (1) to (3) are protected, the blocks (1) to (3) are not selected in this case, and the 64-Kbyte data is written in the block (4).

As described so far, the non-volatile memory element 401 stores the values indicating the last written block, so that a next data write operation can be started from the block next to the last written block. Thus, the written data cannot be destroyed.

FIGS. 5A to 5C illustrate a second embodiment of the present invention. In this embodiment, all the blocks are protected in the initial stage. The protection status memory element group 114 shown in FIG. 5A comprises a 2-bit non-volatile memory element 501 that indicates in which block the program can be started, and a control circuit 502 that receives the output of the non-volatile memory element 501 and a protection temporary cancel command inputted from the outside of the flash memory.

To execute a program in this embodiment, the protection temporary cancel command is inputted. Before that, even if the program is being executed, none of the decoders 106-1 to 106-4 are activated, and the protected state is not cancelled.

Once the protection temporary cancel command is inputted, the protected state of the block indicated by the information stored in the non-volatile memory element 501 to the last block in the memory area is cancelled.

FIG. 5A shows a case where no data is stored in any of the blocks 101-1 to 101-4, and 64-Kbyte data is to be written. Since the information stored in the non-volatile memory element 501 is (0, 0) the protected states of the block (1) to the last block are all cancelled once the protection temporary cancel command is inputted. The 64-Kbyte data is then stored in the block (1). The information (0, 1) for indicating the next block (2) is then stored in the non-volatile memory element 501. When the protection temporary cancel command is suspended, all the blocks in the memory area are again protected.

FIG. 5B shows a case where data has already been stored in the block (1), and 80-Kbyte data is to be added. As in the case shown in FIG. 5A, once the protection temporary cancel command is inputted, the protected states of the block (2) to the last block are cancelled, because the non-volatile memory element 501 holds the information (0, 1) indicating the block (2) at this point. As a result, the 80-Kbyte data is stored in the blocks (2) and (3). The decoder 106-1 of the block (1) is not activated, and the data is not wrongly written in the block (1). Since the data write operation has been performed up to the block (3), the information (1, 0) for indicating the next block (4) is stored in the non-volatile memory element 501. When the protection temporary cancel command is suspended, all the blocks in the memory area are again protected.

FIG. 5C shows a case where 64-Kbyte data is further stored. In this case, only the protected state of the block (4) is canceled, and the 64-Kbyte data is stored in the block (4). Thus, no data can be wrongly written in the blocks (1) to (3).

Figures 6A, 6B:
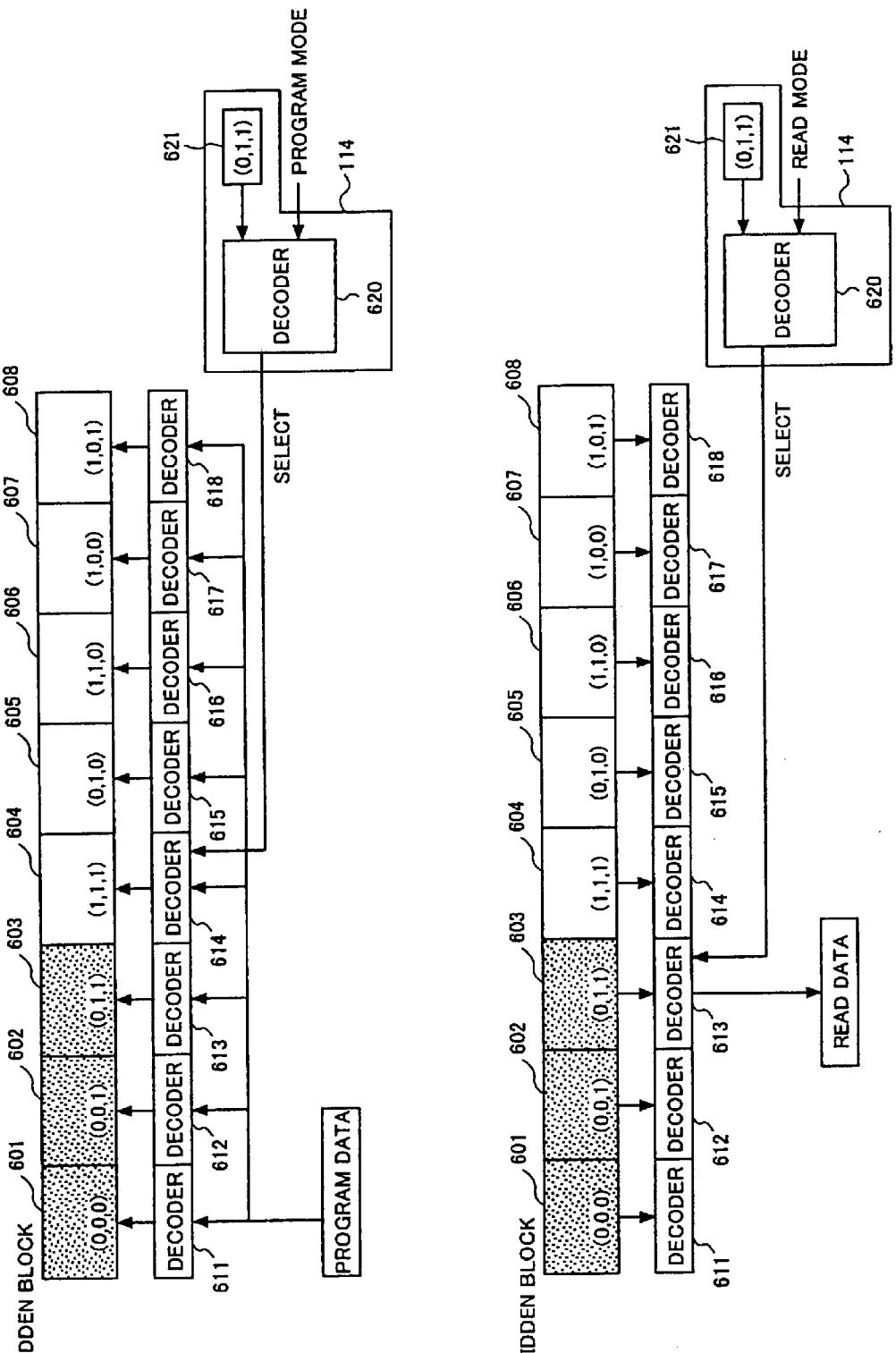
FIGS. 6A and 6B illustrate a third embodiment of the flash memory of the present invention.

FIGS. 6A and 6B illustrate a third embodiment of the present invention. In this embodiment, protection is provided for hidden blocks. The hidden blocks are made up of bits 601 to 608 and decoders 611 to 618. Since the hidden blocks are small in size, only 1 bit serves as a block that is a unit for protection.

FIG. 6A illustrates a case where a program is executed on the hidden blocks. The hidden-block protection status memory element group 114 shown in FIG. 6A includes a 3-bit non-volatile memory element 621 that indicates which is the last bit the program has been executed on, and a decoder 620 that decodes the output of the non-volatile memory element 621 and a program mode command inputted from the outside.

The hidden block access command shown in FIG. 3 is inputted, so that the hidden blocks can be accessed. This state is called a hidden mode.

To execute a program in the hidden mode, the contents of the non-volatile memory element 621 in the hidden-block protection status memory element group 114 are read first, and the program mode command and the output of the non-volatile memory element 621 are decoded by the decoder 620. Thus, the program is started from the bit next to the bit indicated by the contents of the non-volatile memory element 621.

In the case shown in FIG. 6A, the program has been executed on up to the bit 603, and the non-volatile memory element 621 stores the values (0, 1, 1) indicating the bit 603. In this case, more data is to be programmed. The program is started from the next bit 604, and the decoders 611 to 613 corresponding to the bits 601 to 603 are not activated. Thus, no data can be wrongly written in the bits 601 to 603.

FIG. 6B illustrates an operation in which data is read out from the hidden blocks. The hidden block access command 123 shown in FIG. 3 is inputted, so that the hidden blocks can be accessed. Accordingly, without an address inputted form the outside, the data can be automatically read out from the bit indicated in the non-volatile memory element 621. In such a case, the data is read out from the last written bit.

FIGS. 7A and 7B illustrate a fourth embodiment of the present invention. In this embodiment, another protection is provided for the hidden blocks.

FIG. 7A illustrates a case where a program is executed on the hidden blocks. The hidden-block protection status memory element group 114 shown in FIG. 7A includes a 3-bit non-volatile memory element 621 that indicates which bit the program can be started on, and a decoder 620 that decodes the output of the non-volatile memory element 621 and a program mode command and a protection temporary cancel command inputted from the outside.

To execute the program in a hidden mode, the contents of the non-volatile memory element 621 in the hidden-block protection status memory element group 114 are read out, and the decoder 620 decodes the protection temporary cancel command and the program mode command and the output of the non-volatile memory element 621. Thus, the program is started from the bit indicated by the contents of the non-volatile memory element 621.

In the case shown in FIG. 7A, the bits 601 to 603 have already been programmed, the non-volatile memory element 621 stores values (1, 1, 1) indicating the next bit 604, and more data is to be programmed. In such a case, the execution of the program is started from the bit 604 indicated by the contents of the non-volatile memory element 621, and, as in the third embodiment, the decoders 614 to 618 corresponding to the bits 604 to 608 are activated. On the other hand, the decoders 611 to 613 corresponding to the bits 601 to 603 are never activated. Thus, a wrong data write operation can be prevented.

FIG. 7B shows an operation of reading data from the hidden blocks. As described above, the hidden block access command 123 shown in FIG. 3 is inputted so as to enable the access to the hidden blocks. In this manner, the data of the bit immediately before the bit indicated by the contents of the non-volatile memory element 621 is automatically read out. In this case, the data of the last written bit is read out.

Figures 8A, 8B:
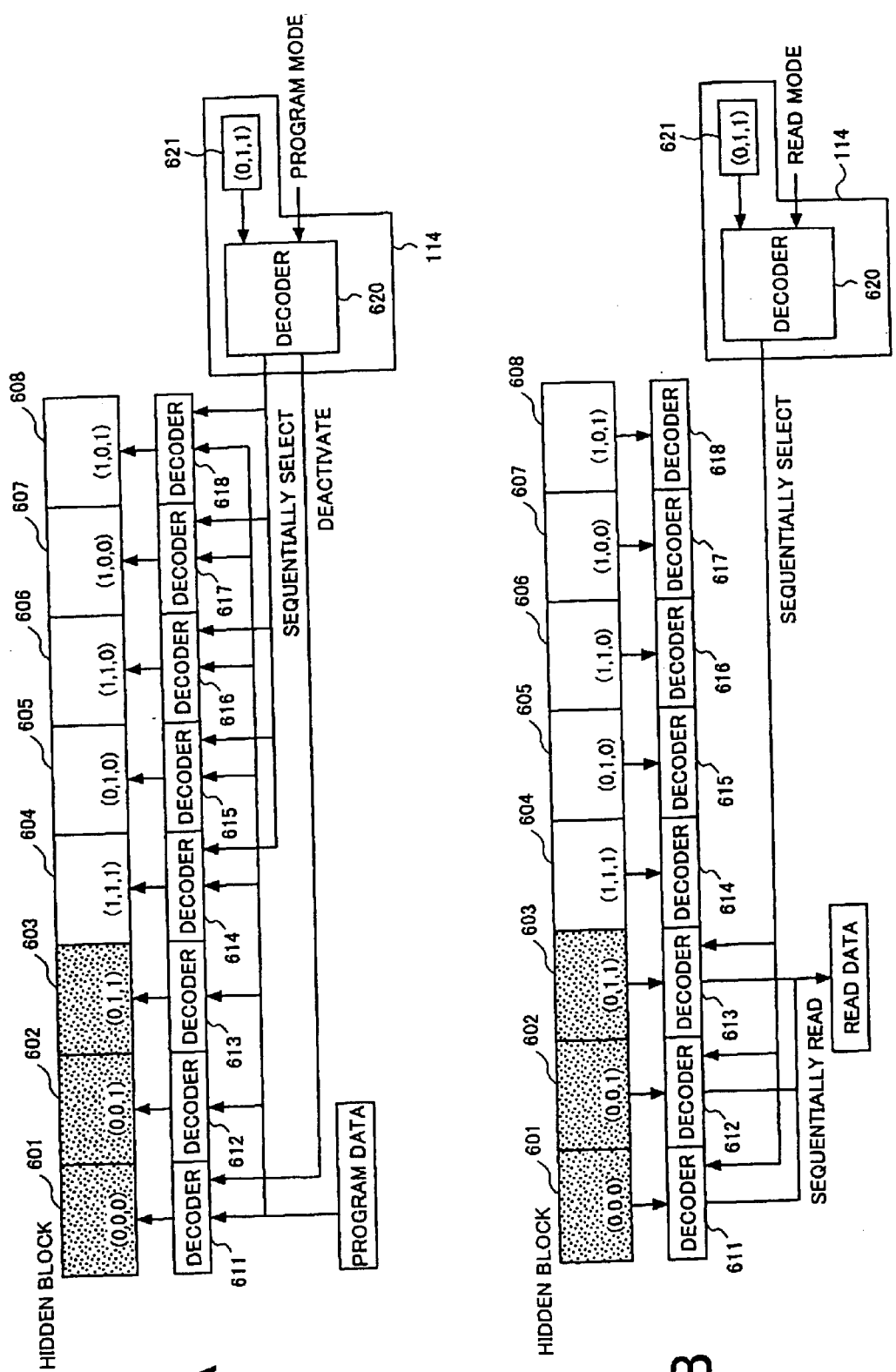
FIGS. 8A and 8B illustrate a fifth embodiment of the flash memory of the present invention.

FIGS. 8A and 8B illustrate a fifth embodiment of the flash memory of the present invention. The flash memory of this embodiment has a serial access port. In FIGS. 8A and 8B, the hidden-block protection status memory element group 114 includes the 3-bit non-volatile memory element 621 that indicates up to which bit the program has been executed, and the decoder 620 that decodes the output of the non-volatile memory element 621 and a program mode command inputted from the outside. In the third embodiment shown in FIGS. 6A and 6B, the program is executed and a data read operation is performed only by the bit. In this embodiment, on the other hand, continuous execution of the program and a continuous read operation can be performed. Accordingly, the program can be executed on and a data read operation can be performed on a plurality of bits at once.

FIG. 8A shows a case where the bits 601 to 603 have already been programmed, the non-volatile memory element 621 stores values (0, 1, 1) indicating the bit 603, and more data is to be programmed in a few bits (or in a few bytes in a byte-unit memory, or in a few words in a word-unit memory). In this case, the program is continuously executed starting from the bit 604 next to the bit 603 indicated by the contents of the non-volatile memory element 621. As in the embodiment shown in FIGS. 6A and 6B, the decoders 611 to 613 corresponding to the bits 601 to 603 are never activated. Thus, a wrong data write operation can be prevented. The decoders 614 to 618 are controlled so that the memory cells can be sequentially selected starting from the fourth bit 604 and a data write operation can be performed sequentially in the selected memory cells.

FIG. 8B illustrates an operation of reading data from the hidden blocks. As described above, the hidden block access command 123 shown in FIG. 3 is inputted so as to enable the access to the hidden blocks. Accordingly, without an address inputted from the outside, data from the first address to the last bit indicated by the non-volatile memory element 621 can be sequentially read out. As described above, in the hidden mode, there is no need to input an externally supplied address.

Figures 9A, 9B:
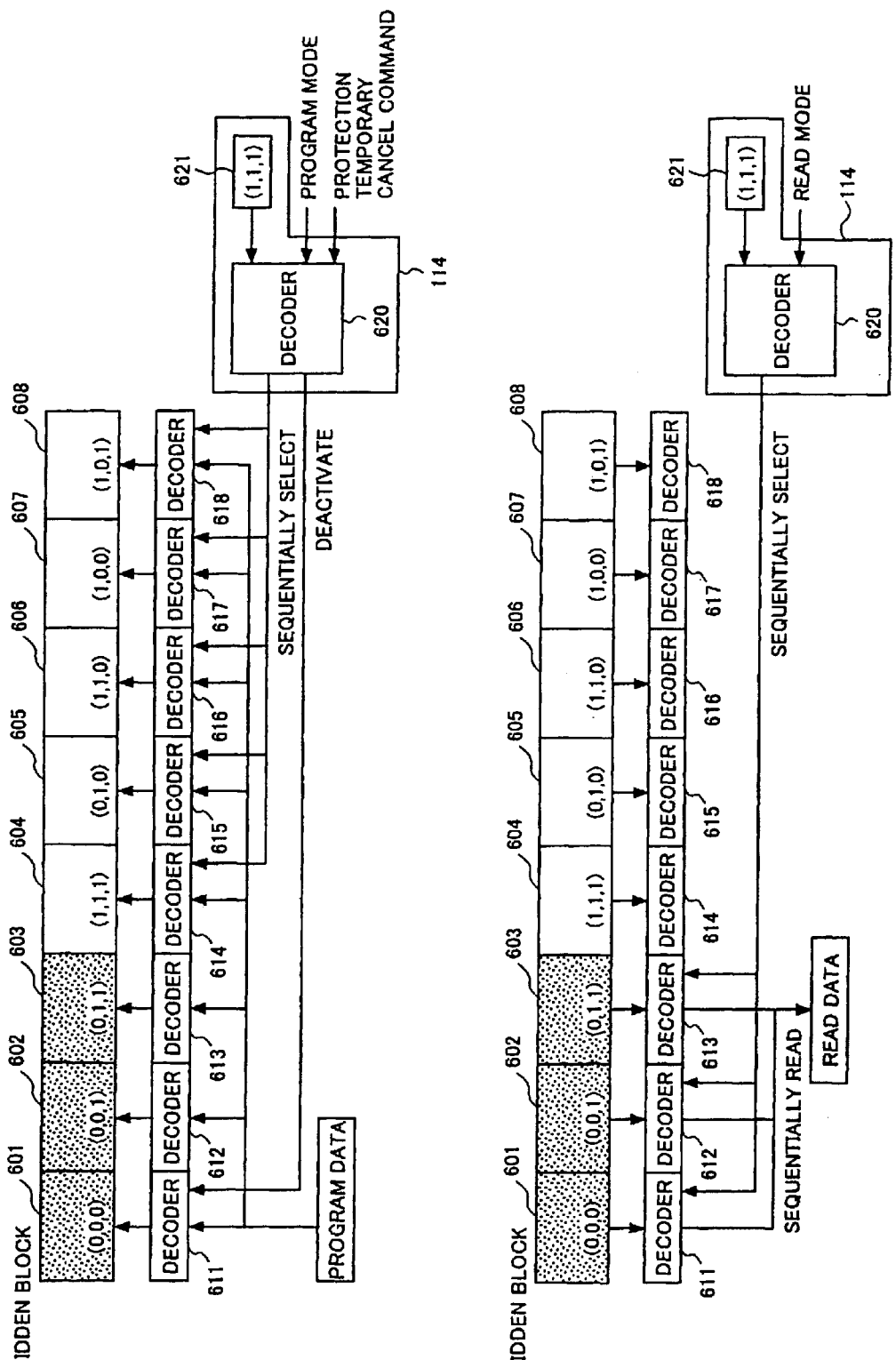
FIGS. 9A and 9B illustrate a sixth embodiment of the flash memory of the present invention.

FIGS. 9A and 9B illustrate a sixth embodiment of the flash memory of the present invention. The flash memory of this embodiment has a serial access port. In FIGS. 9A and 9B, the hidden-block protection status memory element group 114 shown in FIG. 3 includes the 3-bit non-volatile memory element 621 that indicates from which bit the execution of the program can be started, and the decoder 620 that decodes the output of the non-volatile memory element 621 and a program mode command and a protection temporary cancel command inputted from the outside.

In the fourth embodiment shown in FIGS. 7A and 7B, the program is executed and data read is performed only by the bit. In this embodiment, on the other hand, continuous execution of the program and a continuous data read operation are possible. Accordingly, the program can be executed and a data read operation can be performed on a plurality of bits at once.

In the case shown in FIG. 9A, the bits 601 to 603 have already been programmed, the non-volatile memory element 621 stores values (1, 1, 1) indicating the bit next to the bit 603, and more data is to be programmed in a few bits (or in a few bytes in a byte-unit memory, or in a few words in a word-unit memory). In such a case, the execution of the program is started from the bit 604 indicated by the contents of the non-volatile memory element 621. As in the embodiment shown in FIGS. 7A and 7B, the decoders 614 to 618 corresponding to the bits 604 to 608 are activated, while the decoders 611 to 613 corresponding to the bits 601 to 603 are never activated. Thus, a wrong data write operation can be prevented.

FIG. 9B shows an operation of reading data from the hidden blocks. As described above, the hidden block access command 123 is inputted so as to enable the access to the hidden blocks. Accordingly, without an externally inputted address, the data from the first address to the bit immediately before the first bit indicated by the contents of the non-volatile memory element 621 can be sequentially read out. As described above, there is no need to input an address from the outside in the hidden mode.

The present invention is not limited to the specifically disclosed embodiments, but variations and modifications may be made without departing from the scope of the present invention.

The present application is based on Japanese priority application No. 2000-133765, filed on May 2, 2000, the entire contents of which are hereby incorporated by reference.

What is claimed is:

1. A non-volatile semiconductor memory device that is electrically rewritable, comprising:

K non-volatile memory elements that store protection information; and a storage area that is logically divided into $2^k$ or less blocks, wherein successive blocks are released from a write inhibited state in the storage area, in accordance with the protection information stored in the K non-volatile memory elements, and wherein the protection information stored in the K non-volatile memory elements indicates a first block of the successive blocks which are to be released from the write inhibited state.

2. The non-volatile semiconductor memory device as claimed in claim 1, wherein:

the write operation is inhibited from the first block in the storage area to the block immediately before the first block indicated by the protection information stored in the K non-volatile memory elements; and data is sequentially written starting from the first block indicated by the protection information stored in the K non-volatile memory elements.

3. The non-volatile semiconductor memory device as claimed in claim 1, wherein the storage area constitutes a main storage area.

4. The non-volatile semiconductor memory device as claimed in claim 1, wherein the storage area constitutes a storage area other than a main storage area.

5. The non-volatile semiconductor memory device as claimed in claim 4, wherein when an access is made to the storage area other than the main storage area in compliance with a special instruction, a specific one of the blocks is accessed by the protection information stored in the K non-volatile memory elements.

6. The non-volatile semiconductor memory device as claimed in claim 4, wherein:

in a read mode, data stored in the successive blocks in the write inhibited state is read out sequentially from a first block thereof to a last block; and in a write mode, data is sequentially written in successive blocks in a write-enable state from a first block thereof.

* * * * *